(12) United States Patent
Goeke

(10) Patent No.: US 8,810,256 B1
(45) Date of Patent: Aug. 19, 2014

(54) IMPEDANCE METER CALIBRATION

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 992 days.

(21) Appl. No.: 12/336,896

(22) Filed: Dec. 17, 2008

(51) Int. Cl.
*G01R 31/27* (2006.01)

(52) U.S. Cl.
USPC .............................. 324/601; 702/57

(58) Field of Classification Search
CPC .............................. G01R 27/02; G01R 35/005
See application file for complete search history.

(56) References Cited

U.S. PATENT DOCUMENTS

| | | | | |
|---|---|---|---|---|
| 3,824,461 A * | 7/1974 | Preikschat | ...... | 324/670 |
| 4,105,967 A * | 8/1978 | Macemon | ...... | 324/115 |
| 4,963,830 A * | 10/1990 | Roth et al. | ...... | 324/715 |
| 5,012,181 A * | 4/1991 | Eccleston | ...... | 324/74 |
| 5,345,182 A * | 9/1994 | Wakamatsu | ...... | 324/649 |
| 5,463,323 A * | 10/1995 | Wakamatsu | ...... | 324/611 |
| 5,793,214 A * | 8/1998 | Wakamatsu | ...... | 324/601 |
| 5,818,243 A * | 10/1998 | Wakamatsu | ...... | 324/649 |
| 5,886,529 A * | 3/1999 | Wakamatsu | ...... | 324/601 |
| 6,510,392 B2 * | 1/2003 | Doi et al. | ...... | 702/57 |
| 6,737,875 B2 * | 5/2004 | Davis et al. | ...... | 324/548 |
| 7,614,274 B1 * | 11/2009 | Goeke | ...... | 73/1.88 |
| 7,834,641 B1 * | 11/2010 | Goeke | ...... | 324/601 |
| 7,839,195 B1 * | 11/2010 | Feng et al. | ...... | 327/175 |
| 2002/0087277 A1 * | 7/2002 | Doi et al. | ...... | 702/57 |
| 2007/0255992 A1 * | 11/2007 | Sasagawa | ...... | 714/736 |
| 2008/0071487 A1 * | 3/2008 | Zeng et al. | ...... | 324/234 |

FOREIGN PATENT DOCUMENTS

| | | | | |
|---|---|---|---|---|
| GB | 2246639 A * | 2/1992 | ............ | G01R 35/00 |
| JP | 62195576 A * | 8/1987 | ............ | G01R 35/00 |

OTHER PUBLICATIONS

U.S. Appl. No. 11/759,487, filed Jun. 7, 2007, Inventor: Wayne C. Goeke, Title: Phase-Gain Calibration of Impedance/Admittance Meter, 8 pages of specification/claims/abstract and 1 page of drawings.

* cited by examiner

*Primary Examiner* — Jermele M Hollington
(74) *Attorney, Agent, or Firm* — Pearne & Gordon LLP

(57) ABSTRACT

A method for verifying the adjustment for the purpose of calibration of an impedance meter having at least a first and a second measurement range includes measuring within the first range a first measured value of a test impedance; measuring within the second range a second measured value of the test impedance; and comparing the first and second measured values to verify the calibration of the impedance meter.

4 Claims, 1 Drawing Sheet

IMPEDANCE METER CALIBRATION

BACKGROUND OF THE INVENTION

The present invention relates to electrical measurements and, in particular, to impedance meters.

Referring to FIG. 1, an impedance meter 10 is used to measure a test impedance 12. Typically, the meter 10 will have multiple measurement ranges. The multiple ranges help ensure that a measurement can be performed in a range for which the circuit parameters have been optimized for impedances in that range. It is common for the ranges to partially overlap. Measuring an impedance usually includes a current measurement. This is typically done by measuring the voltage drop across a current-sensing resistor in the meter.

A basic requirement for measurements is that a meter be calibrated so the measurements actually correspond to the desired units of measure. It is important to not only initially calibrate a meter, but also, to keep it calibrated.

SUMMARY OF THE INVENTION

A method for verifying the adjustment for the purpose of calibration of an impedance meter having at least a first and a second measurement range includes measuring within the first range a first measured value of a test impedance; measuring within the second range a second measured value of the test impedance; and comparing the first and second measured values to verify the calibration of the impedance meter.

DESCRIPTION OF THE PREFERRED EMBODIMENT

Problems with the calibration of the meter 10 may be identified by measuring a measured impedance value of a test impedance 12 using at least two different measurement ranges. If the first measured impedance value and the second measured impedance value do not correspond (even if the true values for the test impedance are unknown), the calibration of the meter 10 becomes suspect. It is at least out of calibration and perhaps malfunctioning as well.

Figure 1:
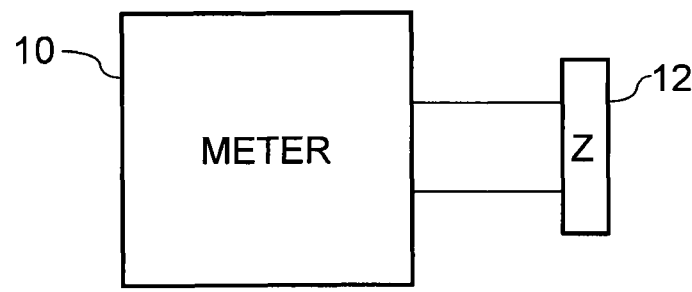
FIG. 1 is a block diagram of an example of an impedance meter suitable for practicing an aspect of the invention.
Figure 2:
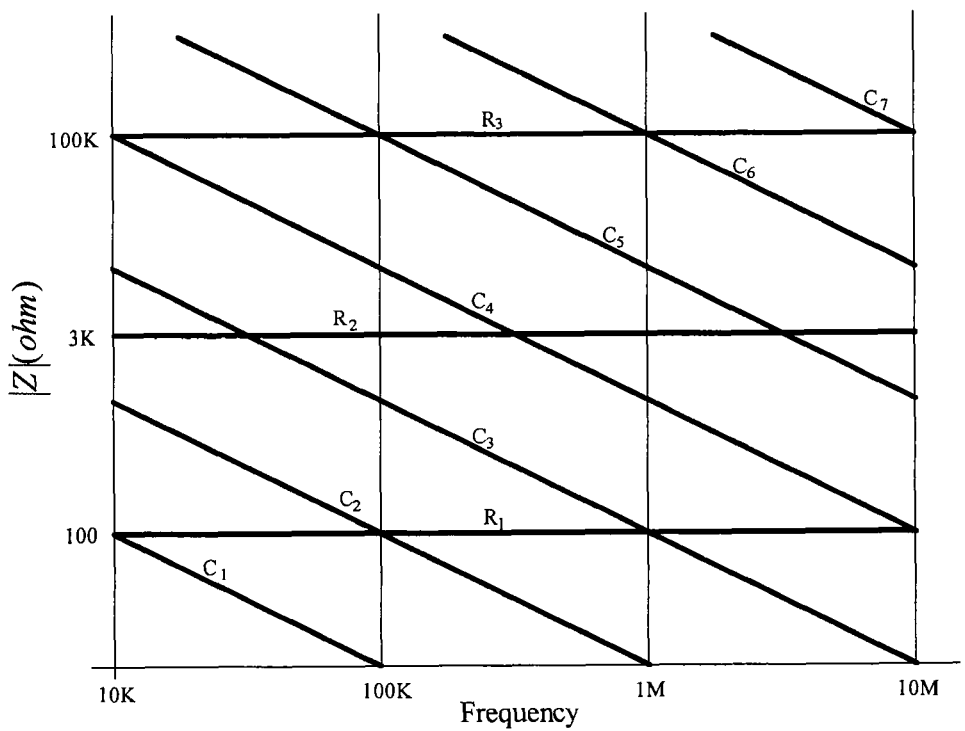
FIG. 2 is a graph of an example of the magnitude response of an impedance meter when measuring the impedance of resistors and capacitors as a function of frequency.

Referring to FIG. 2, it can be seen that if a test impedance is a resistor, the impedance magnitude is constant with frequency. In the case of a capacitive test impedance, the magnitude of the impedance theoretically decreases predictably with frequency. Similar results exist for admittance and inductances.

If a resistive test impedance falls within an overlapping area between ranges, the test impedance can be used to check the calibration of those ranges. If it is not in an overlapping area, it may be necessary to have another resistive test impedance, both with a known value so that the ranges may be independently verified.

In the case of a capacitive (or inductive) test impedance, it will likely be possible to use a single test impedance for both ranges. This is accomplished by measuring the test impedance at two different frequencies. The frequencies are chosen so that the magnitude of the respective measured impedance value is within the meter measurement range desired.

Usually, the best measurement results occur when the test impedance is near the value of the current-sensing resistor. Because of this, results can be further improved if the frequencies are further chosen to have the desired impedance value near the respective current-sensing resistor value.

It is not necessarily required to know the actual capacitive value of the test impedance because the same impedance is used for both measurements; it is just scaled by the chosen frequencies. If the scaled values do not correspond the meters results are suspect.

Referring again to FIG. 2, using multiple resistances and capacitors, it is possible to establish very high confidence in the calibration of the meter in all of its ranges.

The different test impedances may be external to the meter 10, or they may be conveniently provided within the meter itself to provide a self-test function.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for verifying the adjustment for the purpose of calibration of an impedance meter having at least a first and a second impedance measurement range, said method comprising:
   measuring within said first impedance measurement range a first measured value of a test impedance;
   measuring within said second impedance measurement range a second measured value of said test impedance; and
   comparing said first and second measured values to verify the adjustment for the purpose of calibration of the impedance meter.

2. A method according to claim 1, wherein said first measurement and said second measurement are made at different frequencies.

3. A method according to claim 2, wherein said frequencies are chosen to position the magnitude of said first and second measurements toward the value of a current-sensing resistance of the respective range.

4. A method according to claim 2, wherein said test impedance has a known real or imaginary frequency response.

* * * * *